United States Patent [19]

Tomoda

[11] Patent Number: 5,559,316
[45] Date of Patent: Sep. 24, 1996

[54] PLASTIC-MOLDED SEMICONDUCTOR DEVICE CONTAINING A SEMICONDUCTOR PELLET MOUNTED ON A LEAD FRAME

[75] Inventor: Yoshiyuki Tomoda, Tokyo, Japan

[73] Assignee: NEC Corporation, Japan

[21] Appl. No.: 310,698

[22] Filed: Sep. 22, 1994

[30] Foreign Application Priority Data

Sep. 25, 1993 [JP] Japan .................................. 5-261690

[51] Int. Cl.$^6$ ............................ H01L 23/02; H01L 23/28
[52] U.S. Cl. ...................... 257/666; 257/700; 257/676; 257/697; 257/738; 257/780; 174/52.4; 361/813
[58] Field of Search ..................... 257/666, 777, 257/778, 758, 672, 676, 780, 738, 700, 696, 697; 174/52.2, 52.4; 361/813

[56] References Cited

U.S. PATENT DOCUMENTS 5,332,864   7/1994   Liang et al. ........................... 257/700

FOREIGN PATENT DOCUMENTS 60-160135   1/1984   Japan .
0155633    12/1987   Japan ................................... 257/778

*Primary Examiner*—Robert P. Limanek
*Assistant Examiner*—David B. Hardy
*Attorney, Agent, or Firm*—Laff, Whitesel, Conte & Saret, Ltd.

[57] ABSTRACT

A semiconductor device with a semiconductor pellet or pellets mounted on a lead frame and a plastic-molded package, which enables a larger scale integration of circuits than the conventional ones to realize down-sizing. A die pad of the leadframe has a first insulator film formed thereon, a patterned interconnection film formed on the first insulator film, and a second insulator film formed on the first insulator film to cover the interconnection film. Bonding pads of the semiconductor pellet are directly bonded through first windows of the second insulator film to the interconnection film, respectively so that the pellet is electrically connected to the interconnection film. Inner leads of the leadframe are electrically connected through second windows of the second insulator film to the interconnection film, respectively. thus, the bonding pads of the semiconductor pellet are electrically connected through the interconnection film to the inner leads, respectively. The bonding pads are preferably joined to the interconnection film using solder balls.

11 Claims, 7 Drawing Sheets

PLASTIC-MOLDED SEMICONDUCTOR DEVICE CONTAINING A SEMICONDUCTOR PELLET MOUNTED ON A LEAD FRAME

BACKGROUND OF THE INVENTION

1. Field of the Invention

The present invention relates to a semiconductor device and more particularly, to a plastic-molded semiconductor device with a semiconductor pellet or pellets mounted on a lead frame.

2. Description of the Prior Art

A conventional semiconductor device of this type is shown in FIG. 1A. A semiconductor pellet or die 103 is mounted on a die pad 102 of a leadframe 101, and bonding wire pieces 104 are bonded at their ends to interconnect bonding pads or electrodes of the die 103 and corresponding inner leads 101a of the leadframe 101.

The semiconductor pellet 103, the bonding wire pieces 104 and the inner leads 101a are molded in a plastic package 105. Outer leads 101b of the leadframe 101 protrude from the package 105 to the outside thereof.

To keep up with the progress in large-scale integrated circuits, another conventional semiconductor device of this type as shown in FIG. 1B has been developed, which is disclosed, for example, in the Japanese Non-Examined Patent Publication No. 60-160135.

With the prior art device shown in my FIGS. 1A and 1B a semiconductor wiring substrate 203 made of silicon or the like is mounted on a die pad 202 of a leadframe 201. A patterned wiring metal film, such as aluminum (Al), is formed on the surface of the substrate 203. A semiconductor pellet 204 is bonded on the metal film to be mounted on the wiring substrate 203.

Bonding wire pieces 205a are bonded at their ends to interconnect bonding pads or electrodes (not shown) of the die 204 to the wiring metal film of the substrate 203 with each other. Bonding wires pieces 205b are bonded at their ends to interconnect the wiring metal film and inner leads 201a of the leadframe 201.

The pellet 204, the substrate 203 with the wiring metal film, the bonding wire pieces 205a and 205b, and the inner leads 201a are molded in a plastic package 206. Outer leads 201b of the leadframe 201 protrude from the package 205 to the outside thereof.

With the above-described conventional prior art semiconductor device shown in FIG. 1A, the semiconductor pellet 103 and the inner leads 101a are electrically connected with each other by using the bonding wire pieces 104. Also, with the above conventional semiconductor device shown in FIG. 1B, the semiconductor pellet 204 and the wiring substrate 203 are electrically connected with each other by using the bonding wire pieces 205a; then, the wiring substrate 203 and the inner leads 205a are electrically connected with each other using the bonding wire pieces 205b.

Therefore, it is difficult to be reduce the distance between the adjacent bonding pads, or the bonding pad pitch, to 100 to 120 μm or less which is the limit of wire bonding machines. As a result, there is a problem that when a large number of the bonding pads are provided for a larger scale integration of circuits. It is impossible or very difficult to be reduced in size according to the integration scale. This means that the plastic-molded semiconductor device cannot be down-sized.

Taking such the problem into consideration, an improved prior art structure of the semiconductor device is shown in FIG. 1C, in which electrical interconnections between a semiconductor pellet and inner leads are carried out without a wire bonding process.

In FIG. 1C, a leadframe 301 has a die pad 302 depressed below inner leads 301a thereof, and a semiconductor pellet 303 is mounted on the die pad 302. A tape piece 304 for Tape Automated Bonding (TAB) is placed on the pellet 303 and the inner leads 301a so that the bonding pads (not shown) of the pellet 303 and the inner leads 301a are electrically connected with each other through the tape piece 304.

The semiconductor pellet 303, the tape piece 304 and the inner leads 301a are molded in a plastic package 305. Outer leads 301b of the leadframe 301 protrude from the package 305 to the outside thereof.

Since the tape piece 304 for the TAB is made of an insulation film such as polyimide and is finely patterned conductors are formed on a surface of the insulation film. The conductors can be produced in a highly precise manner so that the pitch or distance of the conductors are in accordance with the bonding pads of the pellet 303.

In addition, the electrical interconnection between the patterned conductors of the tape piece 304 and the inner leads 301a can be obtained by positioning and directly bonding the tape piece 304 on the inner leads 301a and the pellet 303.

In a practical bonding process, the bonding pads of the pellet 303 are bonded to one end portions of the patterned conductors. Then, the semiconductor pellet 303 is mounted on the die pad 302. Subsequently, the other end portions of the conductors are bonded to the inner leads 301a.

With the conventional semiconductor device shown in FIG. 1C using the TAB tape piece 304, a step of positioning the tape piece 304 on the pellet 303 is required. Thereafter a step of mounting the pellet 303 with the bonded tape piece 304 to the die pad 302 is also required at the same time as the positioning of the tape piece 304 on the inner leads 301a. Therefore, there is a problem that the assembly process sequence is complicated.

Additionally, since the tape piece 304 extends along the contour of the pellet 303 to link the pellet 303 with the inner leads 301a, it is difficult for a molding material or resin is difficult to flow into a gap formed between the tape piece 304 and the die pad 302 during the molding process. As a result, there is another problem because a good property or quality of the package 304 is difficult to obtain.

Especially, when the die pad 302 is a size which is larger than the size of the pellet 303, the TAB tape piece 304 the size corresponding to the die pad 302, so that the molding material becomes more difficult to flow into the circumferential area of the pellet 303.

To avoid the latter problem, for example, the die pad 302 may be substantially the same size as the pellet 303. However, there arises a problem that standardization of parts or elements is impeded because the lead frame 301 has to be designed and produced according to every size of the pellet 303.

SUMMARY OF THE INVENTION

Accordingly, an object of the present invention is to provide a semiconductor device with a semiconductor pellet or pellets mounted on a lead frame and a plastic-molded package which enables a larger scale integration of circuits than the conventional ones to realize down-sizing.

A semiconductor device according to a first aspect of the present invention contains a lead frame for supporting a semiconductor pellet and a plastic package made of a molding material.

A die pad of the lead frame has a first insulator film formed thereon, a patterned interconnection film formed on the first insulator film, and a second insulator film formed on the first insulator film to cover the interconnection film.

The second insulator film has first windows through which the interconnection film is exposed. Bonding pads of the semiconductor pellet are directly bonded through the first windows to the interconnection film, respectively so that the pellet is electrically connected to the interconnection film.

Further, the second insulator film has second windows through which the interconnection film is exposed. The inner leads are electrically connected through the second windows to the interconnection film, respectively.

The bonding pads of the semiconductor pellet are electrically connected through the interconnection film to the inner leads, respectively.

The package confines the die pad, the first insulator film, the interconnection film, the second insulator film, the pellet and the inner leads. Outer leads of the lead frame protrudes from the package to the outside thereof.

With the semiconductor device according to the first aspect, the bonding pads of the semiconductor pellet are directly bonded through the first windows to the interconnection film, respectively so that the pellet is electrically connected to the interconnection film. Therefore, no wire bonding process is required for the interconnection process between the pellet and the interconnection film.

As a result, even if circuits are integrated on a very large scale in the pellet, the pellet can be mounted on the lead frame. This means that the semiconductor device of the first aspect enables a larger scale integration of circuits than the conventional ones to realize down-sizing.

In a preferred embodiment, the bonding pads of the semiconductor pallet are joined to the interconnection film by using solder balls, respectively.

In this case, since the bonding pads and the interconnection film are directly connected by using the solder balls, even if the semiconductor pellet has very fine-pitch bonding pads, the pellet can be mounted without a problem arising. As a result, the device of the first aspect can easily cope with down-sizing.

Additionally, because the solder balls are placed in the respective second windows of the second insulator film, the pellet is bonded in self-align to the interconnection film by utilizing the fluidity of the solder balls under heat. This leads the pellet to highly accurate bonding even if the positioning accuracy of the pellet relative to the die pad is low.

In another preferred embodiment, the inner leads are joined to the second insulator film. The inner leads thus joined are electrically connected to the interconnection film through the corresponding second windows by using bonding wire pieces, respectively.

In this case, to join the inner leads and the interconnection film, bonding portions of the interconnection film can be arranged at a larger pitch or distance than that of the bonding pads. Therefore, there is an additional advantage because a wire bonding process for joining the inner leads to the bonding portions can be realized at a pitch corresponding to the ability of wire bonding machines.

In still another embodiment, the inner leads are joined to the interconnection film by using solder balls, respectively.

In this case, there is an additional advantage because no wire bonding process is required for the assembly process sequence of the semiconductor device.

A semiconductor device according to a second aspect of the present invention is substantially the same in structure as that of the first aspect other than that a plurality of semiconductor pellets are mounted on a leadframe.

Bonding pads of each of the semiconductor pellets are directly bonded through the corresponding first windows to the interconnection film, respectively so that each of the pellets is electrically connected to the interconnection film. The bonding pads of each of the semiconductor pellets are electrically connected through the interconnection film to the inner leads, respectively.

DESCRIPTION OF THE PREFERRED EMBODIMENTS

Figure 1A:
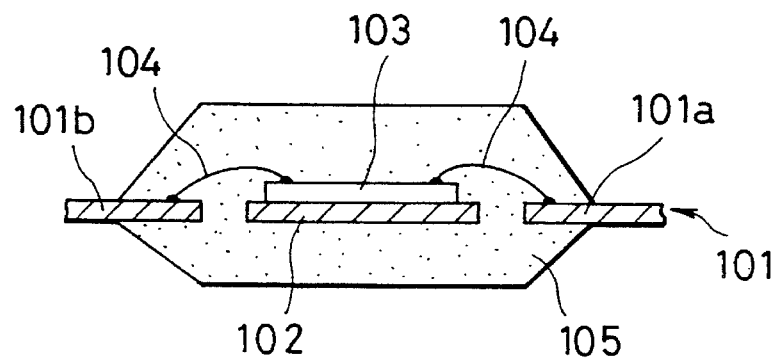
FIG. 1A is a partial cross-section showing a conventional semiconductor device.
Figure 1B:
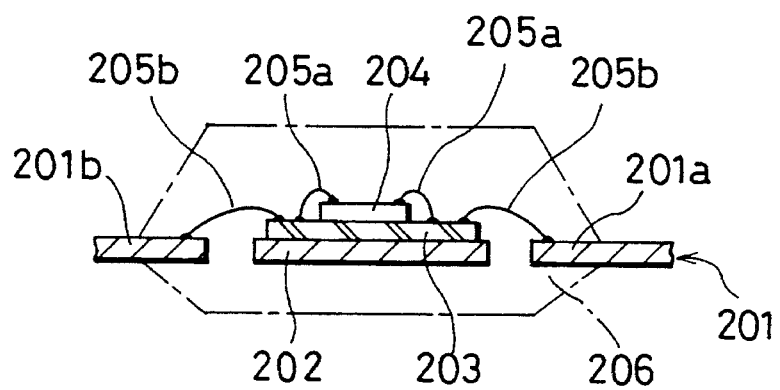
FIG. 1B is a partial cross-section showing another conventional semiconductor device.

Preferred embodiments of the present invention will be described bellow while referring to the drawings attached.

FIGS. 2, 3A, 3B and 4 show a semiconductor device according to a first embodiment.

Figure 2:
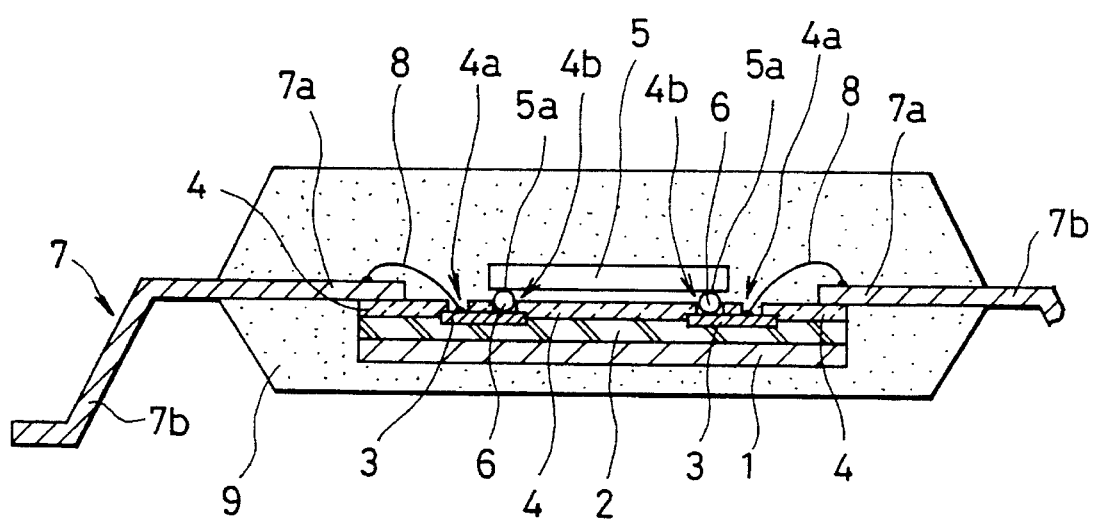
FIG. 2 is a partial cross-section showing a semiconductor device of the type according to a first embodiment of the invention.

As shown in FIG. 2, the semiconductor device contains a multilayer lead frame 7, a semiconductor pellet or die 5 mounted on the lead frame 7, and pieces 8 of a bonding wire made of gold (Au) or the like.

The lead frame 7 has a rectangular die pad 1 made of metal such as copper (Cu), a first insulator film 2 formed on the die pad 1, a second insulator film 4 formed on the first insulator film 2, inner leads 7a joined at their inner ends to the second insulator film 4 with adhesive, and outer leads 7b extending from the corresponding inner leads 7a toward outside. The inner and outer leads 7a and 7b are made of metal such as copper.

The die pad 1 and the first and second insulator films 2 and 4 serve as a heat sink or spreader for sinking or spreading heat produced in the semiconductor pellet 5.

The first insulator film 2 is made of synthetic resin such as polyimide and is adhered to the entire surface of the die pad 1. On the first insulator film 2, there is formed a patterned interconnection film 3 for electrical interconnection between the pellet 5 and the inner leads 7a. The interconnection film 3 is made of a copper foil and is patterned through a photolithography process. The patterned copper foil is covered with a plated metal film such as tin (Sn).

Figure 3A:
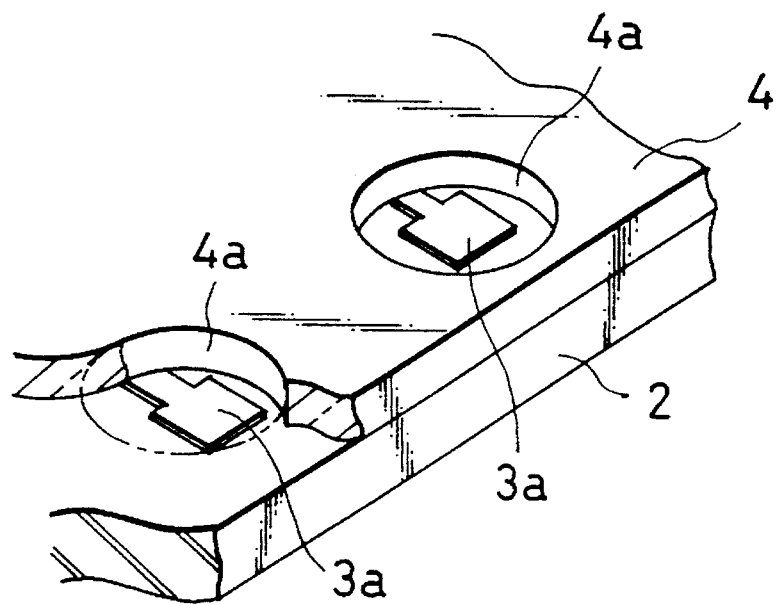
FIG. 3A is a partial perspective view of the semiconductor device of the first embodiment showing the outer bonding portions of the patterned interconnection film.
Figure 3B:
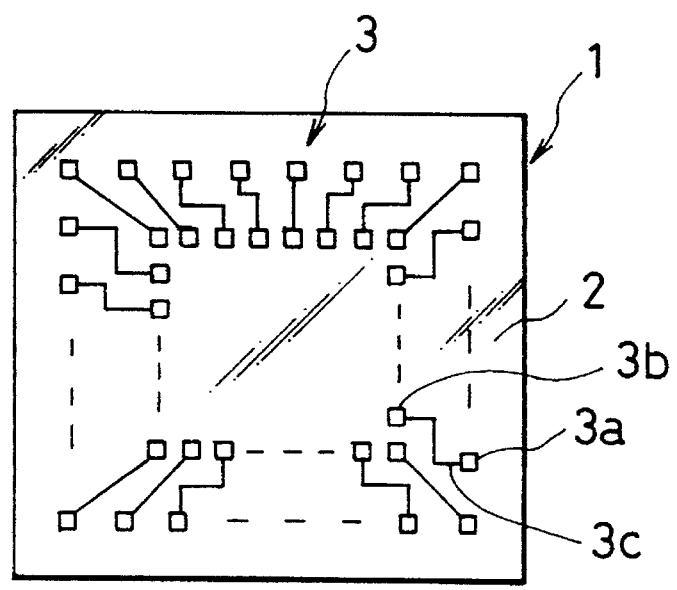
FIG. 3B is a plan view of the first insulator film schematically showing the patterned interconnection film formed thereon.

As shown in FIG. 3B, the patterned interconnection film 3 has conductive lines 3c the number of which is equal to that of bonding pads or electrodes 5a of the semiconductor pellet 5. Each of the lines 3c has an inner bonding portion 3b at its inner end and an outer bonding portion 3a at its outer end.

The second insulator film 4 is made of synthetic resin such as epoxy. The film 4 has outer openings or windows 4a at positions corresponding to the outer bonding portions 3b of the conductive lines 3c, respectively and inner openings or windows 4b at positions corresponding to the inner bonding portions 3b thereof, respectively.

As shown in FIG. 3A, the outer bonding portions 3a of the conductive lines 3c are exposed from the second insulator film 4 through the outer windows 4a, respectively. Similarly, the inner bonding portions 3b of the lines 3c are exposed from the film 4 through the inner windows 4b, respectively.

On the outer bonding portions 3a of the interconnection film 3, solder balls 6 are bonded, respectively. These solder balls 6 are further bonded to the bonding pads 5a of the pellet 5 through the corresponding outer windows 4a of the second insulator film 4, respectively.

Figure 4:
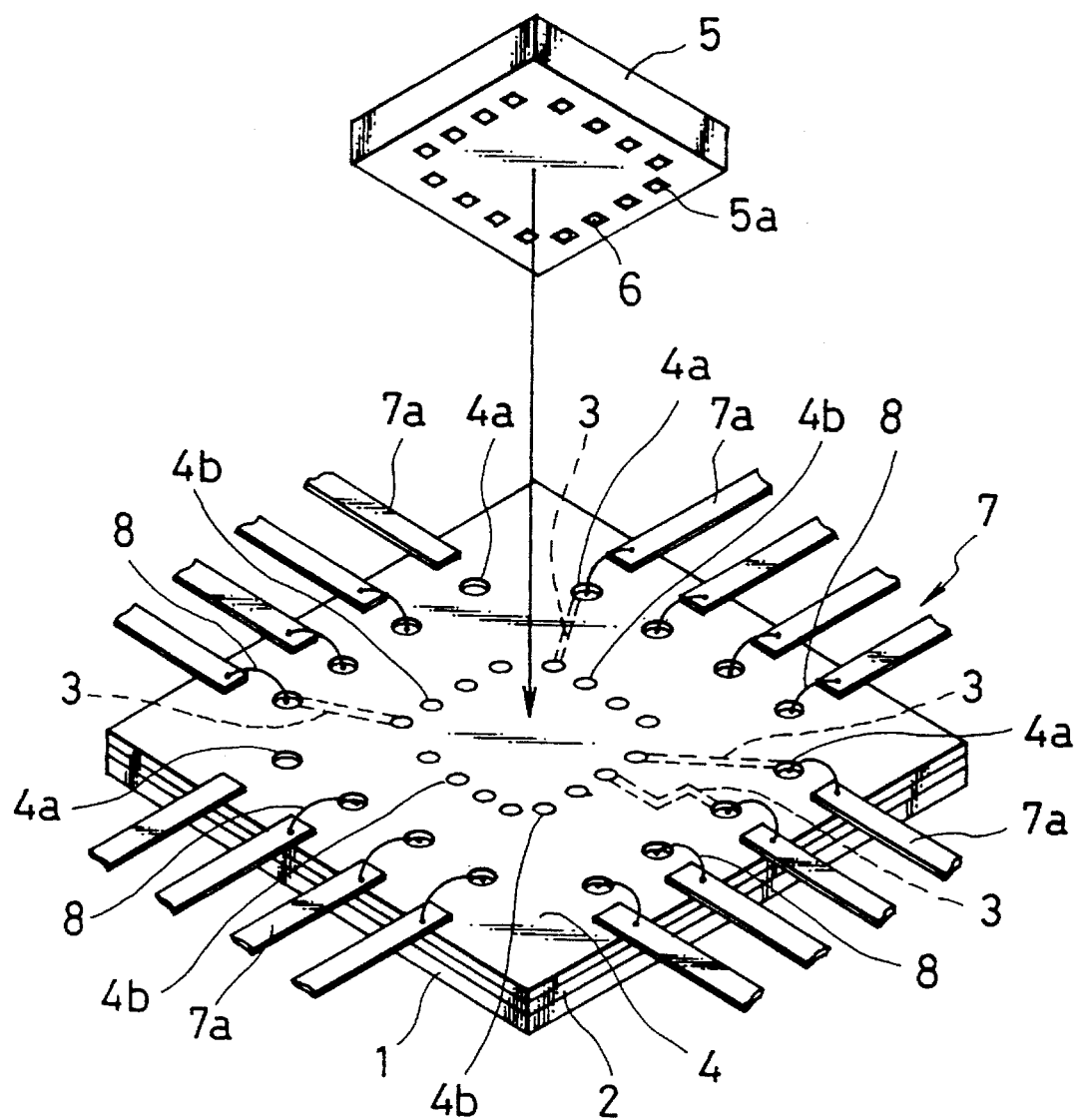
FIG. 4 is a partial perspective view of the semiconductor device of the first embodiment showing the mounting state or situation of the semiconductor pellet to the die pad.

Thus, as shown clearly in FIG. 4, the bonding face of the pellet 5, on which the pads 5a are formed, is directed downwardly toward the die pad 1. In other words, the pallet 5 is bonded to the interconnection film 3 by a "face-down bonding" method which has been popularly employed in the semiconductor device field.

The process step of mounting the semiconductor pellet 5 on the interconnection film 3 is, for example, carried out as the following way:

First, the solder balls 6 are placed on the respective inner bonding portions 3b of the interconnection film 3 within the corresponding windows 4b of the second insulator film 4. Then, the pellet 5 is held horizontally to be lowered toward the die pad 1, and is positioned at a given location. Subsequently, the solder balls 6 are subjected to a heat treatment to be melted, resulting in joints or bonds between the bonding pads 5a and the inner bonding portions 3b by soldering.

Alternatively, first, the solder balls 6 are temporarily bonded to the respective bonding pads 5a. Then, the pellet 5 with the solder balls 6 is held horizontally to be lowered toward the die pad 1, and is positioned so that the solder balls 6 are located on the respective inner bonding portions 3b in the corresponding inner windows 4b of the second insulator film 4. Subsequently, the solder balls 6 are subjected to a heat treatment to be melted. As a result, joints or bonds between the bonding pads 5a and the inner bonding portions 3b are produced by soldering.

On the other hand, as shown in FIG. 4, inner ends of the inner leads 7a are adhered on the square second insulator film 4 at each side thereof. The inner leads 7a and the corresponding outer bonding portions 3a of the interconnection film 3 are respectively linked together by the bonding wire pieces 8 through the corresponding first windows 4a of the second insulator film 4, so that they are electrically connected with each other.

The outer bonding portions 3a of the interconnection film 3 are placed apart from the pellet 5 at the outside thereof, in other words, at the peripheral area of the die pad 1. Therefore, even if circuits are integrated on a very large scale in the pellet 5, the outer bonding portions 3a can be arranged at a larger pitch than that of the bonding pads 5a. Therefore, a wire bonding process for the outer bonding portions 3a and the inner leads 7a can be designed at a pitch corresponding to the ability of wire bonding machines.

After the wire bonding process, the combination of the pellet 5, the lead frame 7 and the bonding wire pieces 8 are molded by a molding material to form the plastic package 9. Thus, the plastic-molded semiconductor device shown in FIG. 2 is obtained.

With the semiconductor device of the embodiment, since the outer bonding portions 3a of the interconnection film 3 and the corresponding inner leads 7a are linked together by the respective bonding wire pieces 8, the molding material easily flows into the gaps between the pieces 8 and the second insulator film 4 during the molding process. Therefore, this molding process can be carried out very well.

When mounting the semiconductor pellet 5 on the die pad 1 of the leadframe 7, the "face-down bonding" technique which has been usually used in the packaging process of such semiconductor devices can be employed. As a result, this process for mounting the pellet 5 can be easily realized and no wire bonding process is required therefor.

Also, the bonding pads 5a are bonded through the inner windows 4b of the second insulator film 4 to the inner bonding portions 3b of the interconnection film 3. Accordingly, even if the semiconductor pellet 5 contains extra bonding pad or pads that should not be bonded to the interconnection film 3, there is no possibility that the extra pad or pads cause a short-circuit.

Further, since the bonding pads 5a and the interconnection film 3 are directly connected by using the solder balls 6, even if the semiconductor pellet 5 has very fine-pitch bonding pads 5a, the pellet 5 can be mounted without a problem arising. As a result, the semiconductor device of the embodiment can cope with down-sizing.

The solder balls 6 are placed in the respective inner windows 4b of the second insulator film 4, so that the pellet 5 can be bonded in self-align to the inner bonding portions 3a of the interconnection film 3 by utilizing the fluidity of the solder balls 6 under heat. This leads the pellet 5 to highly accurate bonding even if the positioning accuracy of the pellet 5 relative to the die pad 1 is low.

Concerning the bonds between the inner leads 7a and the interconnection film 3, the inner leads 7a are adhered on the second insulator film 4 and are bonded with the bonding wire pieces 8 to the corresponding outer bonding portions 3a of the film 3 at the outside of the pellet 5. Therefore, no positioning process of the inner leads 7a relative to the outer bonding portions 3a is required, resulting in a simplification of the assembly process sequence of the semiconductor device.

Also, in the embodiment, the die pad 1 is larger in size than the semiconductor pellet 5; however, the molding material easily flows sufficiently into an area surrounding the pellet 5 because the bonding wire pieces 8 connect the corresponding inner leads 7a to the interconnection film 3. Accordingly, the plastic package 9 can be obtained with less failures (such as voids) than the conventional ones, providing high reliability in the molding process.

Figure 5A:
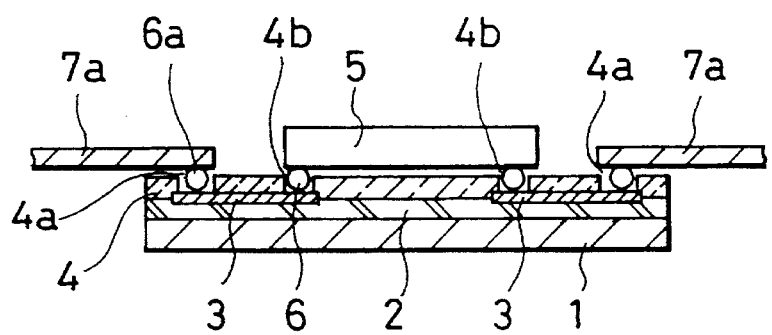
FIG. 5A is a partial cross-section showing a semiconductor device of the type according to a second embodiment of the invention, in which the plastic package is omitted.
Figure 5B:
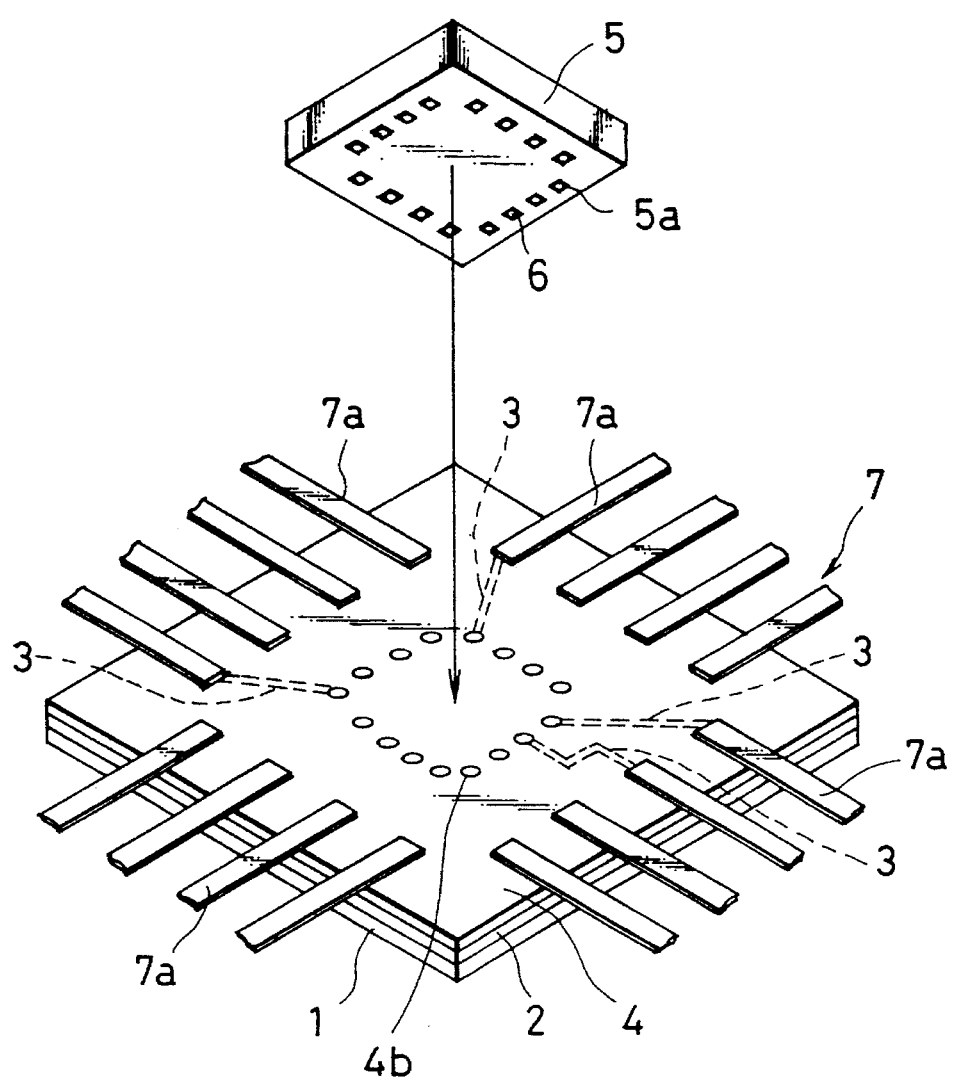
FIG. 5B is a partial perspective view of the semiconductor device of the second embodiment showing the mounting state or situation of the semiconductor pellet to the die pad.

FIGS. 5A and 5B show a semiconductor device of a second embodiment, which is the same in structure as the first embodiment except that the inner leads 7a are bonded to the outer bonding portions 3a of the interconnection film 3 by solder balls 6a instead of the bonding wire pieces 8.

The inner leads 7a are extended to the positions above the respective outer windows 4a of the second insulator film 4. The inner ends of the inner leads 7a are bonded to the respective solder balls 6a placed in the corresponding outer windows 4a.

The second embodiment has the same effects or advantages as those in the first embodiment, but also has the following advantage:

Since no wire bonding process is required for connecting the inner leads 7a to the interconnection film 3 during the assembly process sequence, there is no possibility that the bonding wire pieces 8 are bent to come into contacted with each other so that the adjacent pieces 8 become short-circuited, providing improved reliability.

Figure 1C:
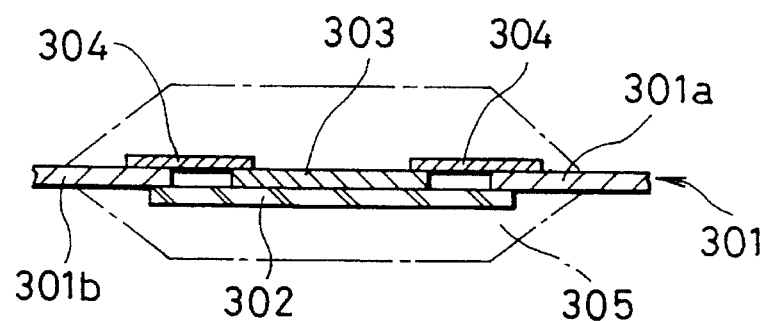
FIG. 1C is a partial cross-section showing still another conventional semiconductor device.

The second embodiment requires a positioning of the inner leads 7a relative to the outer bonding portions 3a of the interconnection film 3. However, during the bonding or soldering process, the solder balls 6a melted under heat automatically flow into the outer windows 4a of the second insulator film 4 to be in contact with the outer bonding portion 3a, so that a comparatively loose tolerance of the positional shift can be permitted. Accordingly, the invention does not require as high a positioning accuracy as the conventional semiconductor device shown in FIG. 1C requires for this positioning process. Thus the inventive semiconductor device can be assembled more easily than the conventional device shown in FIG. 1C.

In addition, because the inner leads 7a are placed closely to the second insulator film 4 and the gap or depression surrounding the pellet 5 on the second insulator film 4 is open, the gap or depression can be filled with the molding material to produce a package in a better condition. As a result, a better quality of the package 9 can be obtained than that of the first embodiment.

Figure 6A:
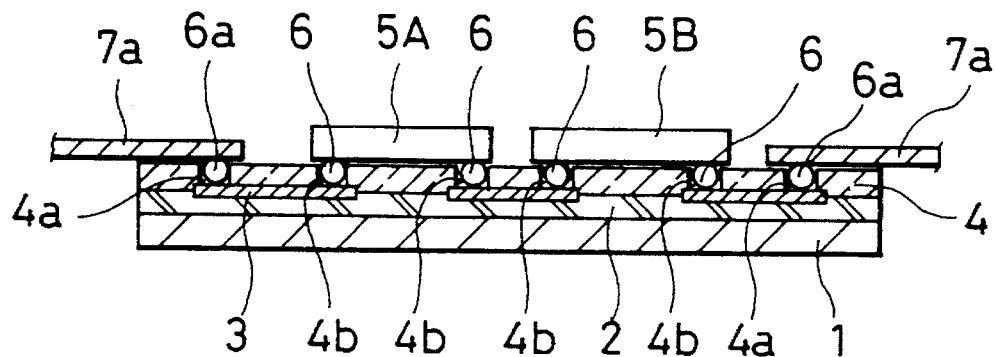
FIG. 6A is a partial cross-section showing a semiconductor device of the type according to a third embodiment of the invention, in which the plastic package is omitted.
Figure 6B:
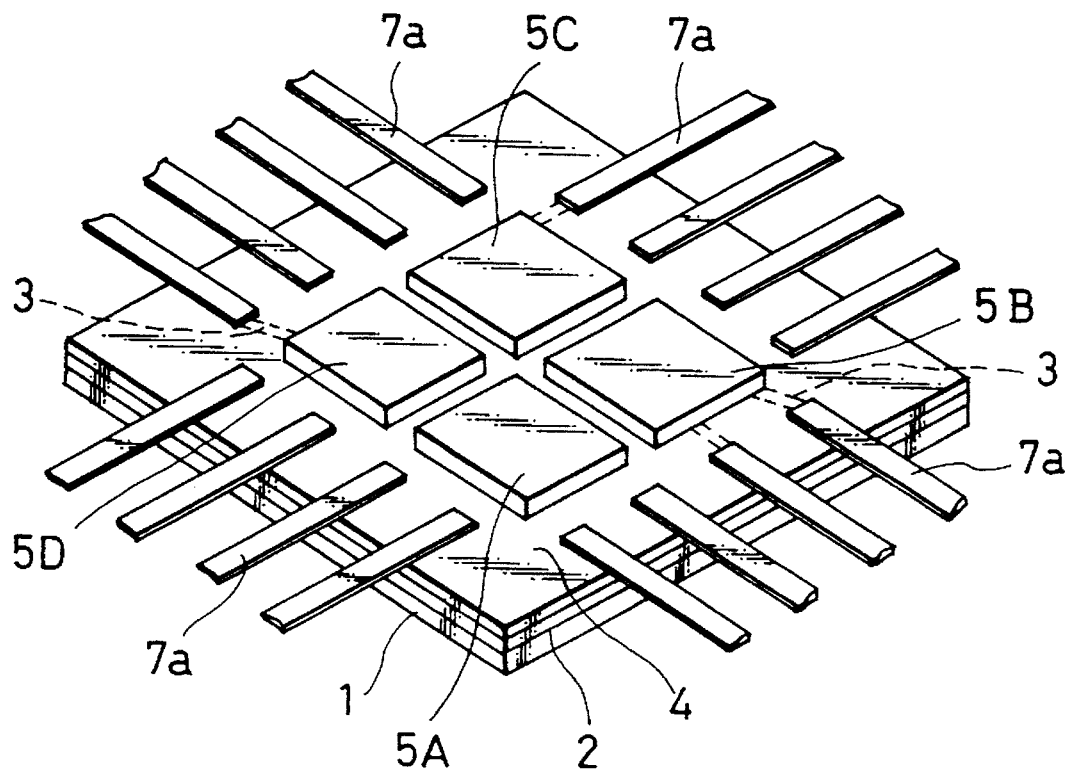
FIG. 6B is a partial perspective view of the semiconductor device of the third embodiment showing the mounting state or situation of the semiconductor pellet to the die pad.

FIGS. 6A and 6B show a semiconductor device of a third embodiment, which is a Hybrid Integrated Circuits (HIC) device. The structure of this as the device is the same structure of the second embodiment except that four semiconductor pellets or dies 5A, 5B, 5C and 5D are mounted on the die pad 1 through the first and second insulator films 2 and 4 instead of the semiconductor pellet 5.

Similar to the second embodiment, the second insulator film 4 has the outer windows 4a disposed in the periphery of the film 4. The inner leads 7a are bonded to the outer bonding portions 3a of the interconnection film 3 by the corresponding solder balls 6a through the respective outer windows 4a.

The second insulator film 4 also has four sets of the inner windows 4b for the semiconductor pellets 5A, 5B, 5C and 5D. Each set of the inner windows 4b are disposed at positions corresponding to the bonding pads 5a of each pellet. The bonding pads 5a of each pellet are bonded to the inner bonding portions 3b of the interconnection film 3 by the corresponding solder balls 6 through the respective inner windows 4b.

Since the semiconductor device of the third embodiment is different from that of the second embodiment in that the four pellets 5A, 5B, 5C and 5D are provided instead of the pellet 5, the same effects or advantages as those in the second embodiment can be obtained.

Figure 7A:
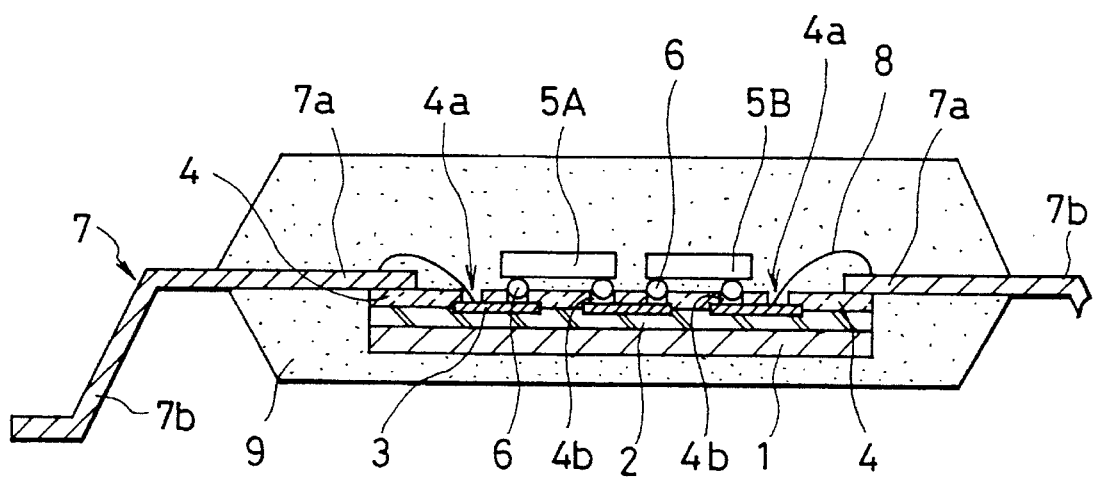
FIG. 7A is a partial cross-section showing a semiconductor device of the type according to a fourth embodiment of the invention.
Figure 7B:
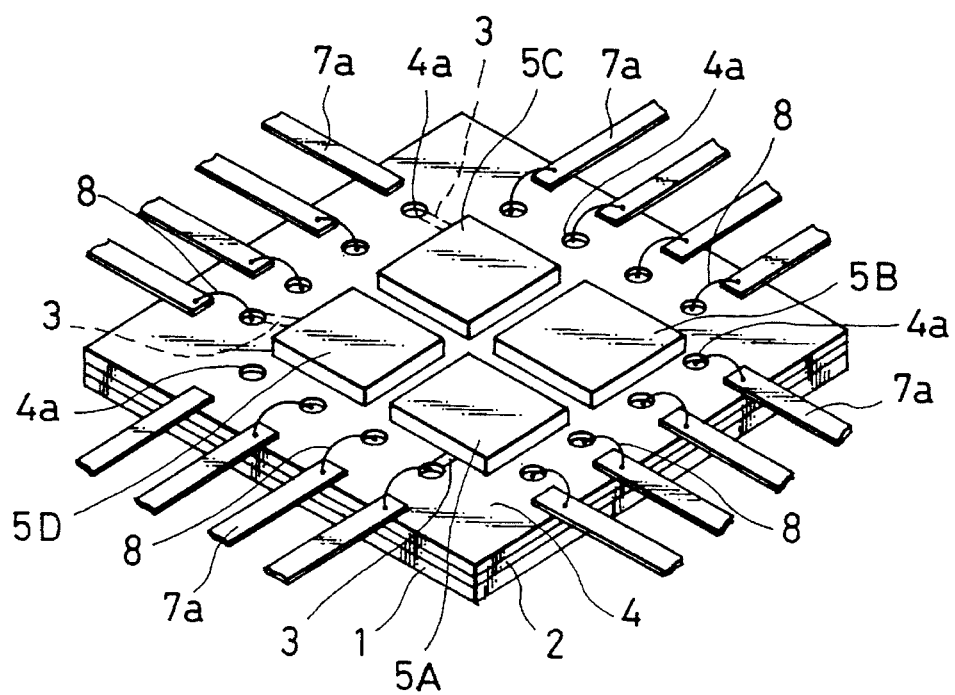
FIG. 7B is a partial perspective view of the semiconductor device of the fourth embodiment showing the mounting state or situation of the semiconductor pellet to the die pad.

FIGS. 7A and 7B show a semiconductor device of a fourth embodiment, which is a Hybrid Integrated Circuits (HIC) device. The structure of this device is the same as the structure of the third embodiment except that the inner leads 7a are bonded to the respective outer bonding portions 3a of the interconnection film 3 by the corresponding bonding wire pieces 8 through the respective outer windows 4a of the second insulator film 4.

In other words the structure of, this device is the same as the structure of the first embodiment except that the four semiconductor pellets 5A, 5B, 5C and 5D are mounted on the die pad 1 through the first and second insulator films 2 and 4 instead of the semiconductor pellet 5.

Therefore, in the semiconductor device of the fourth embodiment, the same effects or advantages as those in the first embodiment can be obtained.

In the first to fourth embodiments described above, since the die pad 1 and the inner leads 7a can be made of different materials, there is an advantage because heat dissipation can be improved by making the die pad thicker.

Also, in the case that the patterned interconnection film 3 is made of the same material as that of the semiconductor pellet 5, for example silicon (Si), thermal stresses generated within the pellet 5 due to the difference in thermal expansion rate can be avoided, effectively preventing cracks in the pellet 5.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A plastic-molded semiconductor device comprising:
   (a) a leadframe including a die pad, inner leads, and outer leads;
   (b) a semiconductor pellet supported by said die pad;
   (c) a first insulator film formed on said die pad;
   (d) a patterned interconnection film for making electrical interconnections between said pellet and said inner leads;
   said interconnection film being formed on said first insulator film and being electrically insulated from said die pad by said first insulator film;
   said interconnection film having first bonding portions for said pellet and second bonding portions for said inner leads;
   (e) a second insulator film formed to cover said interconnection film;
   said second insulator film having first windows for said pellet and second windows for said inner leads to expose said interconnection film therethrough;
   (f) said pellet having bonding pads connected to said respective first bonding portions of said interconnection film through said corresponding first windows, said bonding pads of said semiconductor pellet being further joined to said first bonding portions of said interconnection film by solder balls, respectively, said pellet being electrically connected to said interconnection film by said bonding pads;

(g) said inner leads being electrically connected to said respective second bonding portions of said interconnection film through said corresponding second windows;

(h) a plastic-molded package confining said die pad, said first insulator film, said interconnection film, said second insulator film, said pellet and said inner leads; and (i) said outer leads extending from said corresponding inner leads toward an outside to protrude from said package;

said bonding pads of said semiconductor pellet being electrically connected through said interconnection film to said respective outer leads.

2. A plastic-molded semiconductor device as claimed in claim 1, wherein said inner leads are joined to said second insulator film, and said inner leads thus joined are electrically connected to said second bonding portions of said interconnection film through said corresponding second windows by bonding wire pieces, respectively.

3. A plastic-molded semiconductor device as claimed in claim 1, wherein said inner leads are joined to said second bonding portions of said interconnection film by solder balls, respectively.

4. A plastic-molded semiconductor device comprising:

a leadframe for supporting a semiconductor pellet;

said leadframe including a die pad, inner leads, and outer leads;

said die pad having a first insulator film formed thereon, a patterned interconnection film formed on the first insulator film, and a second insulator film formed on the first insulator film to cover the interconnection film; said second insulator film having first windows through which said interconnection film is exposed;

bonding pads of said semiconductor pellet being bonded through said first windows to said interconnection film, respectively, so that said pellet is electrically connected to said interconnection film;

said second insulator film having second windows through which said interconnection film is exposed;

said inner leads being electrically connected through said second windows to said interconnection film, respectively, said inner leads being joined to said second insulator film, and said inner leads thus joined being electrically connected to said interconnection film through said corresponding second windows by using bonding wire pieces; respectively;

said outer leads extending from said corresponding inner leads toward an outside of said molded semiconductor device;

a plastic package made of a molding material;

said package confining said die pad, said first insulator film, said interconnection film, said second insulator film, said pellet and said inner leads; and said outer leads protruding from said package to the outside of said molded semiconductor device;

said bonding pads of said semiconductor pellet being electrically connected through said interconnection film to said inner leads, respectively.

5. A plastic-molded semiconductor device comprising:

(a) a leadframe including a die pad, inner leads, and outer leads;

(b) a semiconductor pellet supported by said die pad;

(c) a first insulator film formed on said die pad;

(d) a patterned interconnection film for making electrical interconnection between said pellet and said inner leads;

said interconnection film being formed on said first insulator film and being electrically insulated from said die pad by said first insulator film;

said interconnection film having first bonding portions for said pellet and second bonding portions for said inner leads;

(e) a second insulator film formed to cover said interconnection film;

said second insulator film having first windows for said pellet and second windows for said inner leads to expose said interconnection film therethrough;

(f) said pellet having bonding pads connected to said respective first bonding portions of said interconnection film through said corresponding first windows, said pellet being electrically connected to said interconnection film by said bonding pads;

(g) said inner leads being electrically connected to said respective second bonding portions of said interconnection film through said corresponding second windows, said inner leads being further joined to said second bonding portions of said interconnection film by solder balls, respectively;

(h) a plastic-molded package confining said die pad, said first insulator film, said interconnection film, said second insulator film, said pellet and said inner leads; and (i) said outer leads extending from said corresponding inner leads toward outside to protrude from said package;

said bonding pads of said semiconductor pellet being electrically connected through said interconnection film to said respective outer leads.

6. A plastic-molded semiconductor device comprising:

a leadframe for supporting semiconductor pellets;

said leadframe including a die pad, inner leads, and outer leads;

said die pad having a first insulator film formed thereon, a patterned interconnection film formed on the first insulator film, and a second insulator film formed on the first insulator film to cover the interconnection film;

said second insulator film having first windows through which said interconnection film is exposed;

bonding pads of each of said semiconductor pellets being directly bonded through said corresponding first windows to said inter connection film, respectively so that each of said pellets is electrically connected to said interconnection film;

said second insulator film having second windows through which said interconnection film is exposed;

said inner leads being electrically connected through said second windows to said interconnection film, respectively;

said outer leads extending from said corresponding inner leads toward outside, respectively;

a plastic package made of a molding material;

said package confining said die pad, said first insulator film, said interconnection film, said second insulator film, said pellets and said inner leads; and said outer leads protruding from said package to the outside;

wherein said bonding pads of said semiconductor pellet are electrically connected through said interconnection film to said inner leads, respectively.

7. A plastic-molded semiconductor device as claimed in claim 6, wherein said bonding pads of each of said semiconductor pellets are joined to said first bonding portions of said interconnection film by solder balls, respectively.

8. A plastic-molded semiconductor device as claimed in claim 7, wherein said inner leads are joined to said second insulator film, and said inner leads thus joined are electrically connected to said second bonding portions of said interconnection film through said corresponding second windows by bonding wire pieces, respectively.

9. A plastic-molded semiconductor device as claimed in claim 7, wherein said inner leads are joined to said second bonding portions of said interconnection film by solder balls, respectively.

10. A plastic-molded semiconductor device as claimed in claim 6, wherein said inner leads are joined to said second bonding portions of said interconnection film by solder balls, respectively.

11. A plastic-molded semiconductor device comprising:

a leadframe for supporting semiconductor pellets;

said leadframe including a die pad, inner leads, and outer leads;

said die pad having a first insulator film formed thereon, a patterned interconnection film formed on the first insulator film, and a second insulator film formed on the first insulator film to cover the interconnection film;

said second insulator film having first windows through which said interconnection film is exposed;

bonding pads of said semiconductor pellets being bonded through said corresponding first windows to said interconnection film, respectively, so that each of said pellets is electrically connected to said interconnection film;

said second insulator film having second windows through which said interconnection film is exposed;

said inner leads being electrically connected through said second windows to said interconnection film, respectively, said inner leads being joined to said second insulator film, and said inner leads thus joined being electrically connected to said interconnection film through said corresponding second windows by using bonding wire pieces; respectively;

said outer leads extending from said corresponding inner leads toward an outside of said molded semiconductor device;

a plastic package made of a molding material;

said package confining said die pad, said first insulator film, said interconnection film, said second insulator film, said pellet and said inner leads; and said outer leads protruding from said package to the outside of said molded semiconductor device;

said bonding pads of said semiconductor pellet being electrically connected through said interconnection film to said inner leads, respectively.

\* \* \* \* \*